(12) United States Patent
Pagaila et al.

(10) Patent No.: US 8,263,434 B2
(45) Date of Patent: Sep. 11, 2012

(54) SEMICONDUCTOR DEVICE AND METHOD OF MOUNTING DIE WITH TSV IN CAVITY OF SUBSTRATE FOR ELECTRICAL INTERCONNECT OF FI-POP (75) Inventors: Reza A. Pagaila, Singapore (SG); Heap Hoe Kuan, Singapore (SG); Dioscoro A. Merilo, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 255 days.

(21) Appl. No.: 12/533,943

(22) Filed: Jul. 31, 2009

(65) Prior Publication Data
US 2011/0024888 A1 Feb. 3, 2011

(51) Int. Cl.
*H01L 21/00* (2006.01)
(52) U.S. Cl. ........................................ 438/109; 438/108
(58) Field of Classification Search .................. 438/108, 438/109
See application file for complete search history.

(56) References Cited

U.S. PATENT DOCUMENTS

| | | | |
|---|---|---|---|
| 6,706,553 B2 * | 3/2004 | Towle et al. | 438/106 |
| 7,211,900 B2 * | 5/2007 | Shin et al. | 257/777 |
| 7,839,649 B2 * | 11/2010 | Hsu | 361/761 |
| 2002/0190396 A1 * | 12/2002 | Brand | 257/787 |
| 2004/0026773 A1 * | 2/2004 | Koon et al. | 257/692 |
| 2004/0152235 A1 * | 8/2004 | Lee | 438/106 |
| 2007/0155048 A1 * | 7/2007 | Lee et al. | 438/106 |
| 2007/0200230 A1 | 8/2007 | Chow et al. | |
| 2008/0237833 A1 * | 10/2008 | Hsu et al. | 257/691 |
| 2008/0272477 A1 * | 11/2008 | Do et al. | 257/686 |
| 2009/0091015 A1 * | 4/2009 | Shen et al. | 257/686 |
| 2009/0236735 A1 * | 9/2009 | Corisis et al. | 257/723 |
| 2009/0302452 A1 * | 12/2009 | Camacho et al. | 257/692 |
| 2010/0007001 A1 * | 1/2010 | Wang et al. | 257/686 |
| 2010/0072596 A1 * | 3/2010 | Pagaila et al. | 257/686 |
| 2010/0148336 A1 * | 6/2010 | Do et al. | 257/686 |

* cited by examiner

*Primary Examiner* — James Mitchell
(74) *Attorney, Agent, or Firm* — Robert D. Atkins; Patent Law Group: Atkins & Associates, P.C.

(57) ABSTRACT

A semiconductor device has a substrate with a cavity formed through first and second surfaces of the substrate. A conductive TSV is formed through a first semiconductor die, which is mounted in the cavity. The first semiconductor die may extend above the cavity. An encapsulant is deposited over the substrate and a first surface of the first semiconductor die. A portion of the encapsulant is removed from the first surface of the first semiconductor die to expose the conductive TSV. A second semiconductor die is mounted to the first surface of the first semiconductor die. The second semiconductor die is electrically connected to the conductive TSV. An interposer is disposed between the first semiconductor die and second semiconductor die. A third semiconductor die is mounted over a second surface of the first semiconductor die. A heat sink is formed over a surface of the third semiconductor die.

20 Claims, 9 Drawing Sheets

SEMICONDUCTOR DEVICE AND METHOD OF MOUNTING DIE WITH TSV IN CAVITY OF SUBSTRATE FOR ELECTRICAL INTERCONNECT OF FI-POP

FIELD OF THE INVENTION

The present invention relates in general to semiconductor devices and, more particularly, to a semiconductor device and method of mounting a semiconductor component with TSV in a cavity of a substrate for electrical interconnect of Fi-PoP.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

In many applications, it is desirable to stack a plurality of semiconductor die over one another to form a stacked semiconductor package. However, stacking semiconductor die also increases the overall size and thickness of the semiconductor package. For example, in packages including three or more stacked die, the package requires several substrates to facilitate the formation of electrical interconnections between each of the semiconductor die. In conventional packages, for example, three substrates are often required when forming fan-in package-on-package (Fi-PoP) packages to form the necessary connections between top, middle, and bottom die. Even if one substrate is used, the die mounted to opposite sides of the substrate increase package thickness and lengthen propagation paths which degrades electrical performance.

SUMMARY OF THE INVENTION

A need exists to electrically interconnect stacked semiconductor die in a Fi-PoP arrangement. Accordingly, in one embodiment, the present invention is a method of making a semiconductor device comprising the steps of providing a substrate having first and second surfaces, forming a cavity through the first and second surfaces of the substrate, forming a via through a first semiconductor die, filling the via with conductive material to form a conductive via, mounting the first semiconductor die in the cavity, depositing an encapsulant over the substrate and a first surface of the first semiconductor die, removing a portion of the encapsulant from the first surface of the first semiconductor die to expose the conductive via, and mounting a second semiconductor die to the first surface of the first semiconductor die. The second semiconductor die is electrically connected to the conductive via. The method further includes the step of mounting a third semiconductor die over a second surface of the first semiconductor die opposite the first surface of the first semiconductor die.

In another embodiment, the present invention is a method of making a semiconductor device comprising the steps of providing a substrate having first and second surfaces, forming a cavity through the first and second surfaces of the substrate, and mounting a first semiconductor component in the cavity. The first semiconductor component has a conductive TSV. The method further includes the steps of depositing an encapsulant over the substrate and a first surface of the first semiconductor component, removing a portion of the encapsulant from the first surface of the first semiconductor component to expose the conductive TSV, and mounting a second semiconductor component to the first surface of the first semiconductor component. The second semiconductor component is electrically connected to the conductive TSV.

In another embodiment, the present invention is a method of making a semiconductor device comprising the steps of providing a substrate having first and second surfaces, forming a cavity through the first and second surfaces of the substrate, and mounting a first semiconductor component over the cavity. The first semiconductor component has a conductive TSV. The method further includes the steps of mounting a second semiconductor component over a first surface of the first semiconductor component, depositing an encapsulant over the substrate and second semiconductor component, and mounting a third semiconductor component over a second surface of the first semiconductor component opposite the first surface of the first semiconductor component.

In another embodiment, the present invention is a semiconductor device comprising a substrate having a cavity formed through first and second surfaces of the substrate. A first semiconductor component is mounted in the cavity. The first semiconductor component has a conductive TSV. A second semiconductor component is mounted over a first surface of the first semiconductor component. An encapsulant is deposited over the substrate and second semiconductor component. A third semiconductor component is mounted over a second surface of the first semiconductor component opposite the first surface of the first semiconductor component.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1:
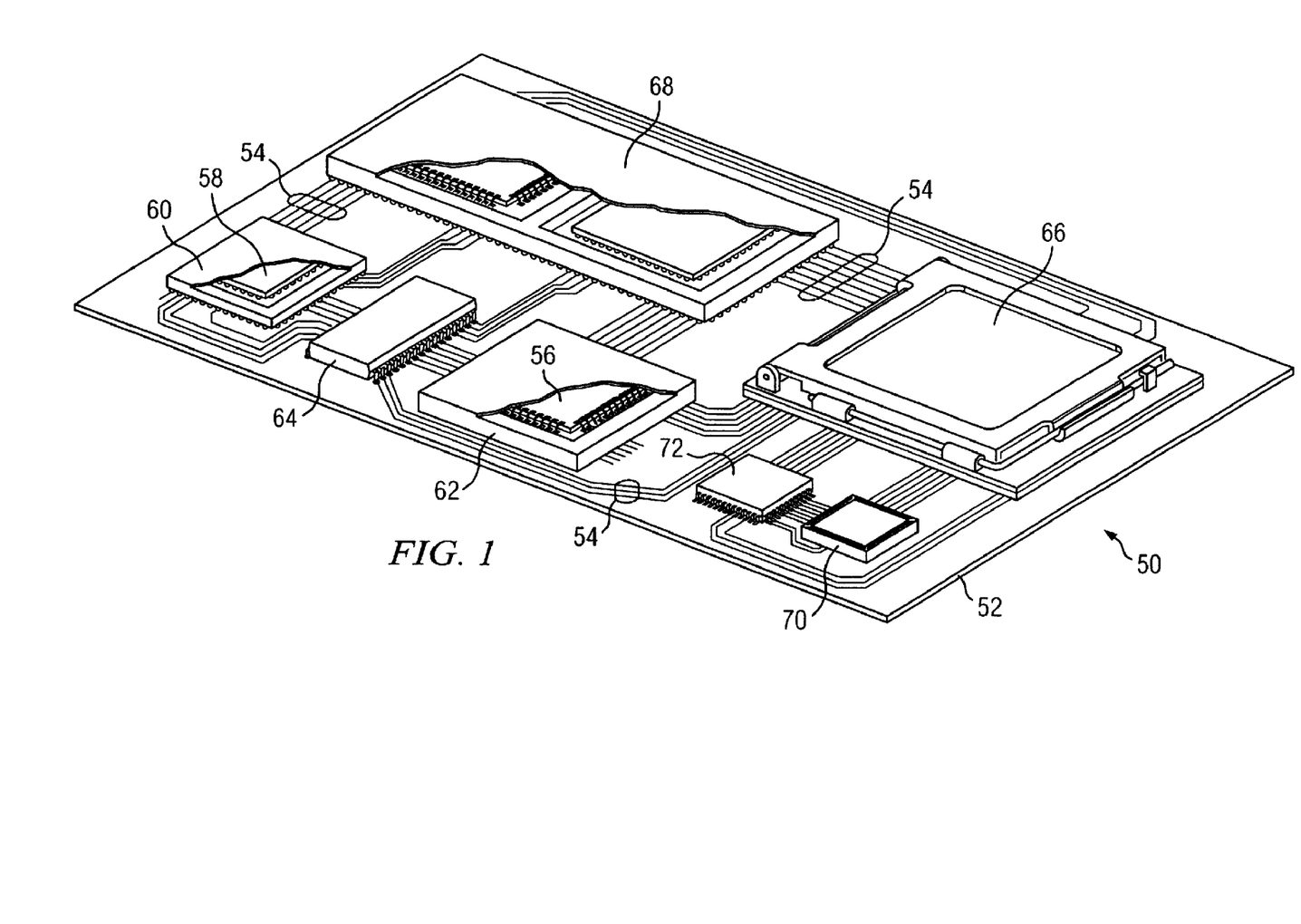
FIG. 1 illustrates a PCB with different types of packages mounted to its surface.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
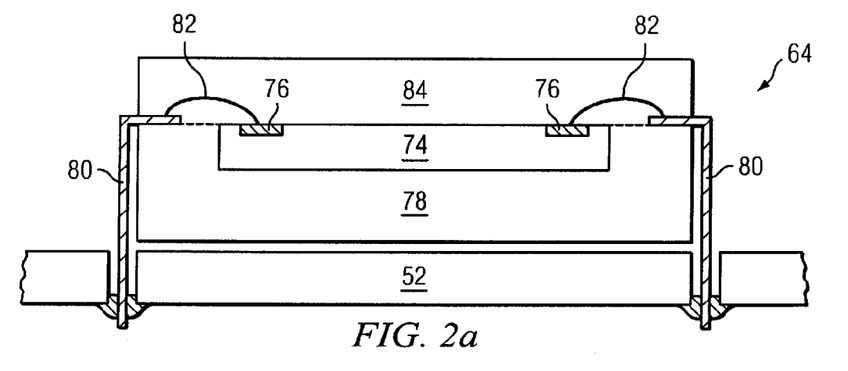
FIGS. 2a-2c illustrate further detail of the representative semiconductor packages mounted to the PCB.
Figure 2B:
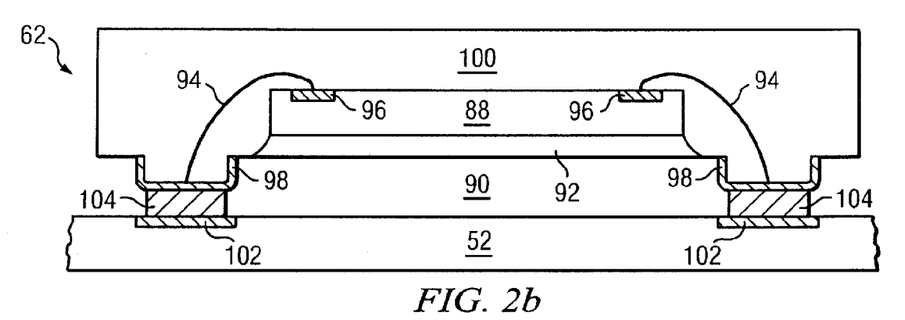
Figure 2C:
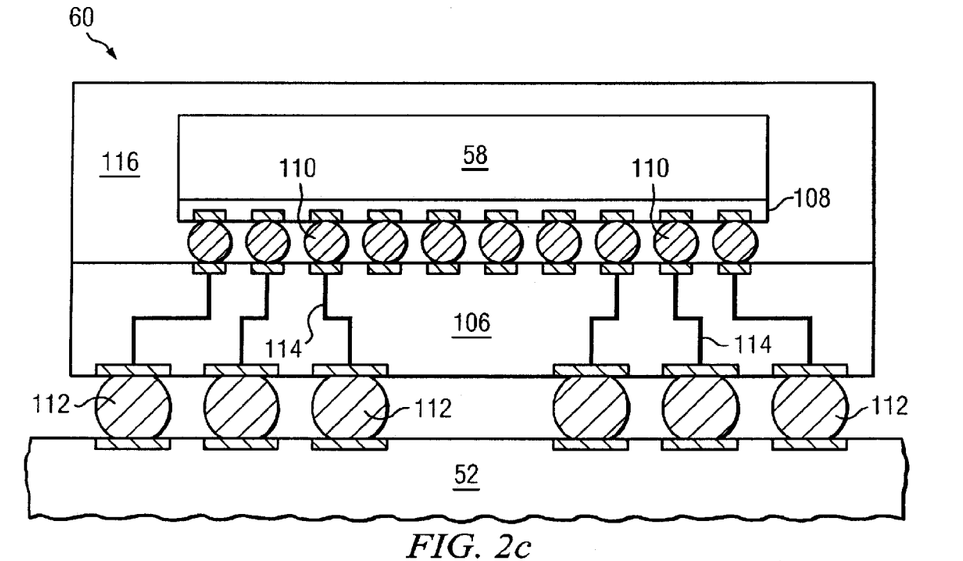

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packing interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition such electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
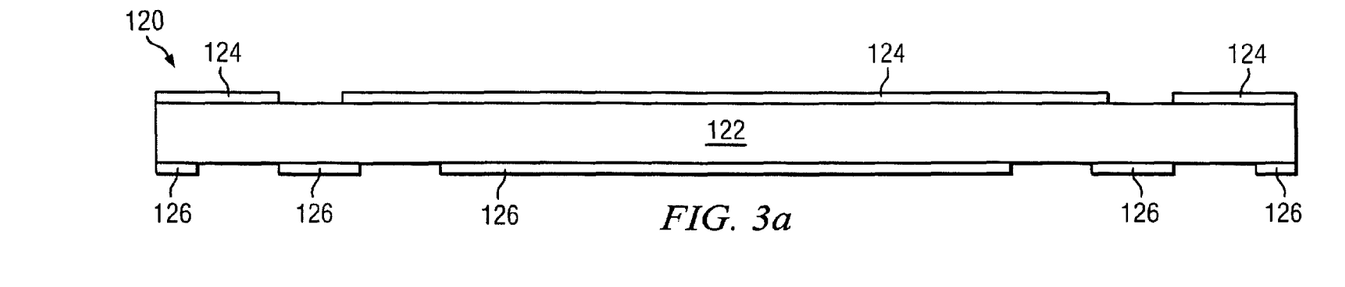
FIGS. 3a-3h illustrate forming a Fi-PoP with a semiconductor die having TSV mounted in a cavity of a substrate.

FIGS. 3a-3h illustrate, in relation to FIGS. 1 and 2a-2c, a process of forming a Fi-PoP with a semiconductor die having TSV mounted in a cavity of a substrate. FIG. 3a shows a semiconductor wafer 120 containing a base substrate material 122 such as silicon, germanium, gallium arsenide, indium phosphide, or silicon carbide, for structural support. An insulating or passivation layer 124 is formed over a first surface of substrate material 122. Likewise, an insulating or passivation layer 126 is formed over a second surface of substrate material 122, opposite the first surface of substrate material 122. The insulating layers 124 and 126 contain one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. The insulating layers 124 and 126 are formed using PVD, CVD, printing, spin coating, spray coating, sintering, or thermal oxidation. A portion of insulating layers 124 and 126 is removed as shown.

Figure 3B:
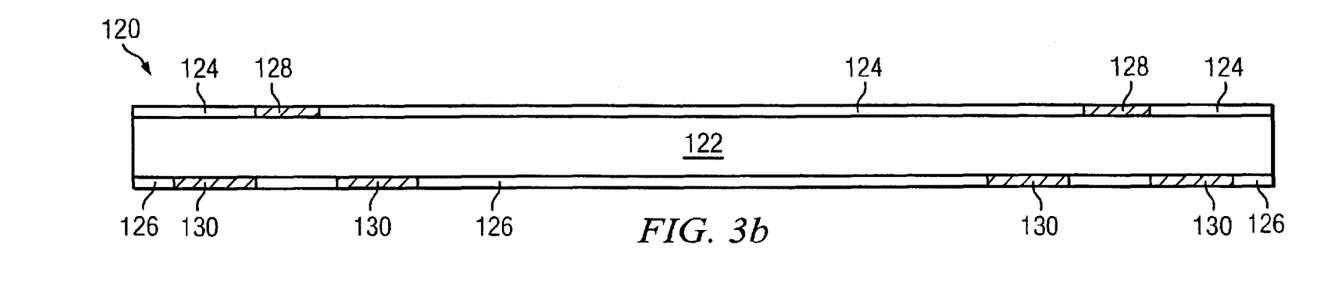

In FIG. 3b, an electrically conductive layer 128 is formed in the removed portion of insulating layer 124 and electrically conductive layer 130 is formed in the removed portion of insulating layer 126 using patterning with PVD, CVD, sputtering, electrolytic plating, electroless plating process, or other suitable metal deposition process. Conductive layers 128 and 130 can be one or more layers of Al, Cu, Sn, Ni, Au, Ag, or other suitable electrically conductive material. The portions of conductive layers 128 and 130 can be electrically common or electrically isolated depending on the design and function of the semiconductor device.

Figure 3C:
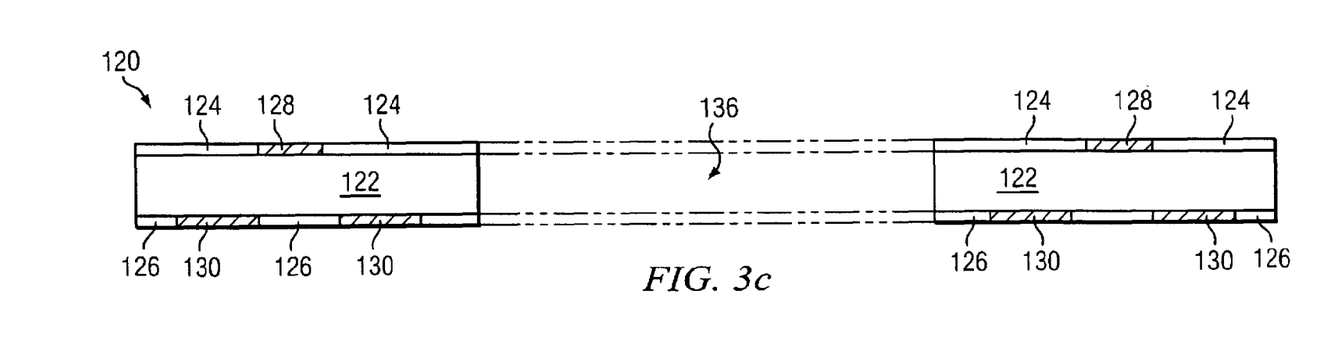

In FIG. 3c, a cavity or opening 136 is formed through insulating layers 124 and 126 and substrate material 122 using laser cutting tool or saw blade. Cavity 136 can be rectangular, circular, or other suitable form factor.

Figure 3D:
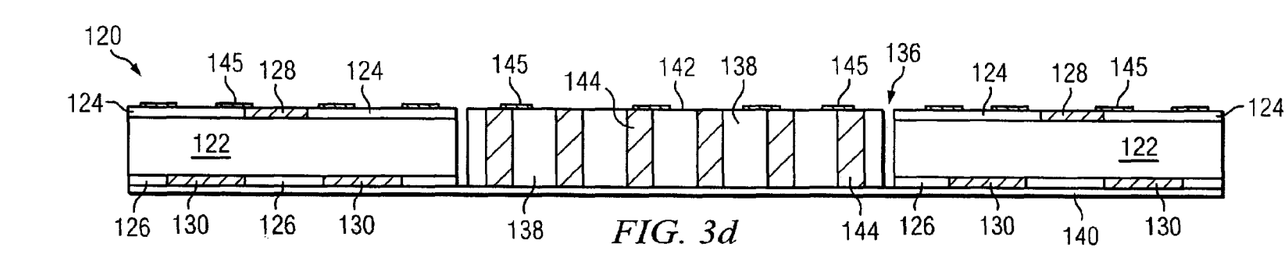

In FIG. 3d, a semiconductor die or component 138 is disposed in cavity 136 and secured with backing tape 140. Semiconductor die 138 includes an active surface 142 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 142 to implement baseband analog circuits or digital circuits, such as digital signal processor (DSP), ASIC, memory, or other signal processing circuit. Semiconductor die 138 may also contain IPD, such as inductors, capacitors, and resistors, for RF signal processing. A typical RF system requires multiple IPDs in one or more semiconductor packages to perform the necessary electrical functions. A semiconductor die with through organic via (TOV) can be disposed in cavity 136. In another embodiment, semiconductor die or component 138 is an interposer with TSVs disposed in cavity 136.

A plurality of vias is formed through semiconductor die or interposer 138 using laser drilling or etching process, such as deep reactive ion etching (DRIE). The vias are filled with Al, Cu, Sn, Ni, Au, Ag, titanium (Ti), W, poly-silicon, or other suitable electrically conductive material using PVD, CVD, electrolytic plating, electroless plating process, or other suitable metal deposition process to form conductive through silicon vias (TSV) 144. TSV 144 can be formed in semiconductor die 138 prior to mounting the die in cavity 136. TSV 144 can be electrically interconnected according to the design of the die with optional redistribution layers (RDL) 145 on active surface 142 and substrate 120.

Figure 3E:
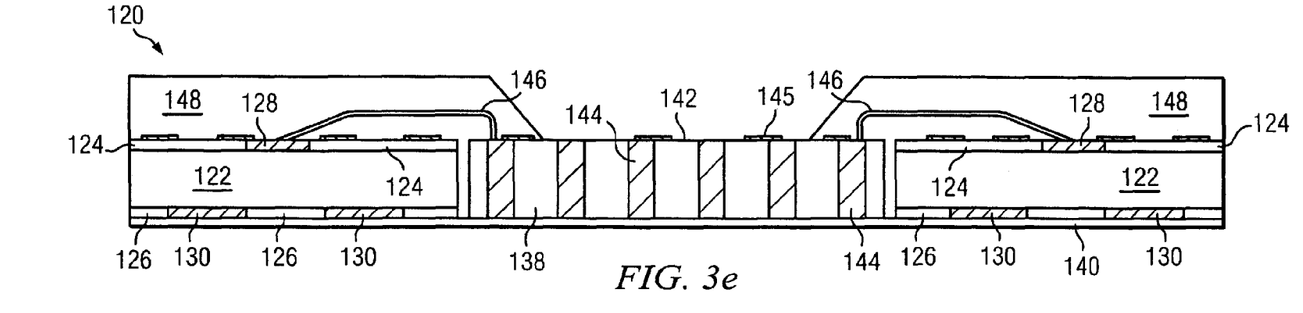
Figure 3F:
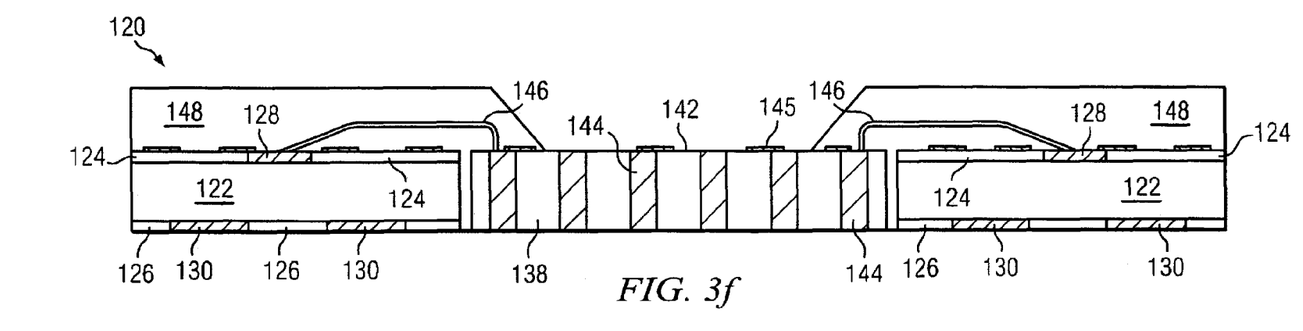

In FIG. 3e, bond wires 146 are formed between conductive layer 128 and TSV 144. An encapsulant or molding compound 148 is deposited over semiconductor die 138 and insulating layer 124 using a paste printing, compressive molding, transfer molding, liquid encapsulant molding, vacuum lamination, or other suitable applicator. Encapsulant 148 can be polymer composite material, such as epoxy resin with filler, epoxy acrylate with filler, or polymer with proper filler. Encapsulant 148 is non-conductive and environmentally protects the semiconductor device from external elements and contaminants. A portion of encapsulant 148 is removed by an etching process to expose active surface 142 and TSV 144. Backing tape 140 is removed in FIG. 3f.

Figure 3G:
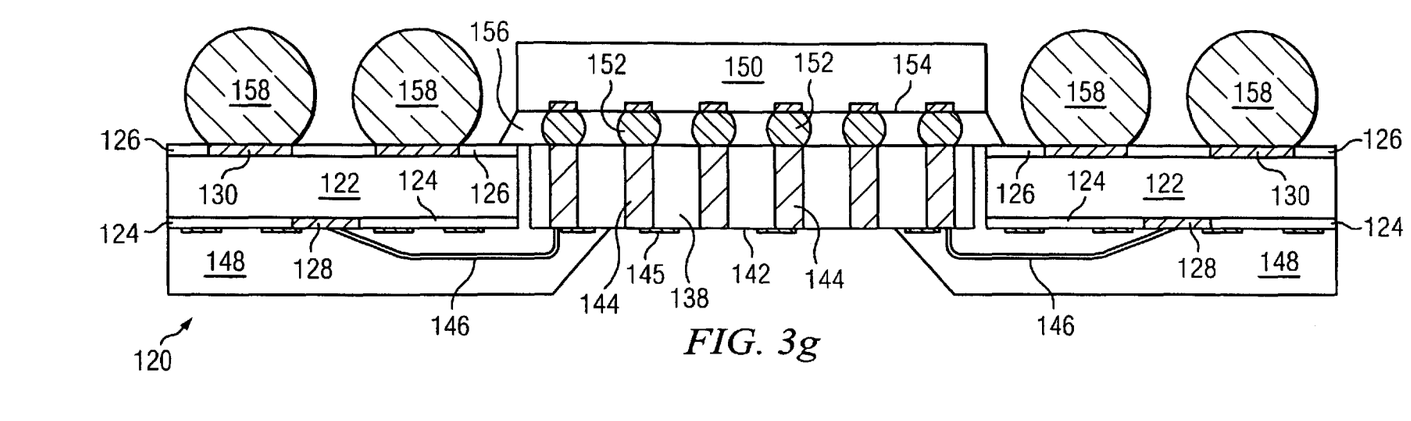

In FIG. 3g, the device is inverted and semiconductor die or component 150 is mounted to TSV 144, opposite active surface 142, using bumps 152. Semiconductor die 150 includes an active surface 154 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 154 to implement baseband analog circuits or digital circuits, such as DSP, ASIC, memory, or other signal processing circuit. Semiconductor die 150 may also contain IPD, such as inductors, capacitors, and resistors, for RF signal processing. A typical RF system requires multiple IPDs in one or more semiconductor packages to perform the necessary electrical functions. An underfill material 156 such as epoxy resin is deposited under semiconductor die 150. In another embodiment, semiconductor component 150 can be a discrete semiconductor device mounted to TSV 144.

An electrically conductive bump material is deposited over conductive layer 130 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 130 using a suitable attachment or bonding process. In one embodiment, the bump material is reflowed by heating the material above its melting point to form spherical balls or bumps 158. In some applications, bumps 158 are reflowed a second time to improve electrical contact to conductive layer 130. The bumps can also be compression bonded to conductive layer 130. Bumps 158 represent one type of interconnect structure that can be formed over conductive layer 130. The interconnect structure can also use bond wires, stud bump, micro bump, or other electrical interconnect.

In FIG. 3h, the device is again inverted and semiconductor die or component 160 with contact pads 162 oriented downward in a flipchip arrangement is mounted to TSV 144 with bumps 164. Semiconductor die 160 is mounted in the removed portion of encapsulant 148 to reduce device thickness. Semiconductor die 160 includes an active surface 166 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 166 to implement baseband analog circuits or digital circuits, such as DSP, ASIC, memory, or other signal processing circuit. Semiconductor die 160 may also contain IPD, such as inductors, capacitors, and resistors, for RF signal processing. A typical RF system requires multiple IPDs in one or more semiconductor packages to perform the necessary electrical functions. In another embodiment, semiconductor component 160 can be a discrete semiconductor device mounted to TSV 144.

Figure 4:
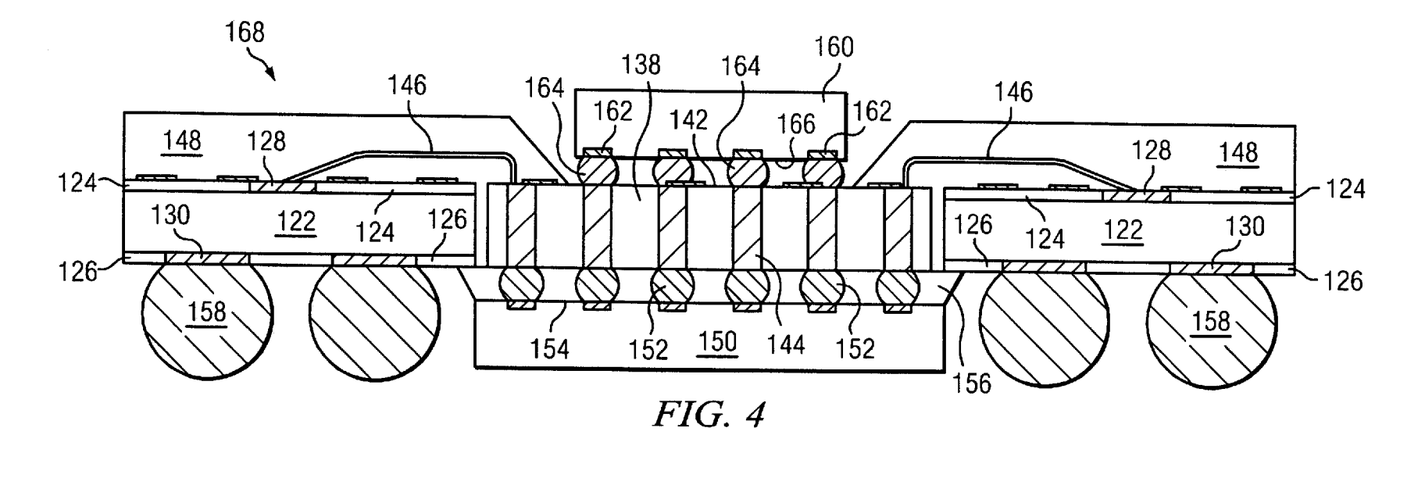
FIG. 4 illustrates stacked die interconnected through the TSV die in the substrate cavity.

FIG. 4 shows Fi-PoP 168 having the semiconductor die, IPD, or interposer with TSV or TOV disposed in cavity 136 of substrate 120. The TSV or TOV electrically interconnect semiconductor components 150 and 160. By placing semiconductor die, IPD, or interposer with TSV or TOV in cavity 136, the height of Fi-PoP 168 can be reduced. In addition, mounting semiconductor die 160 in the removed portion of encapsulant 148 also reduces the thickness of Fi-PoP 168. The signal propagation between semiconductor components 150 and 160 is reduced by direct connection through the TSV or TOV of the semiconductor die, IPD, or interposer disposed in cavity 136.

Figure 3H:
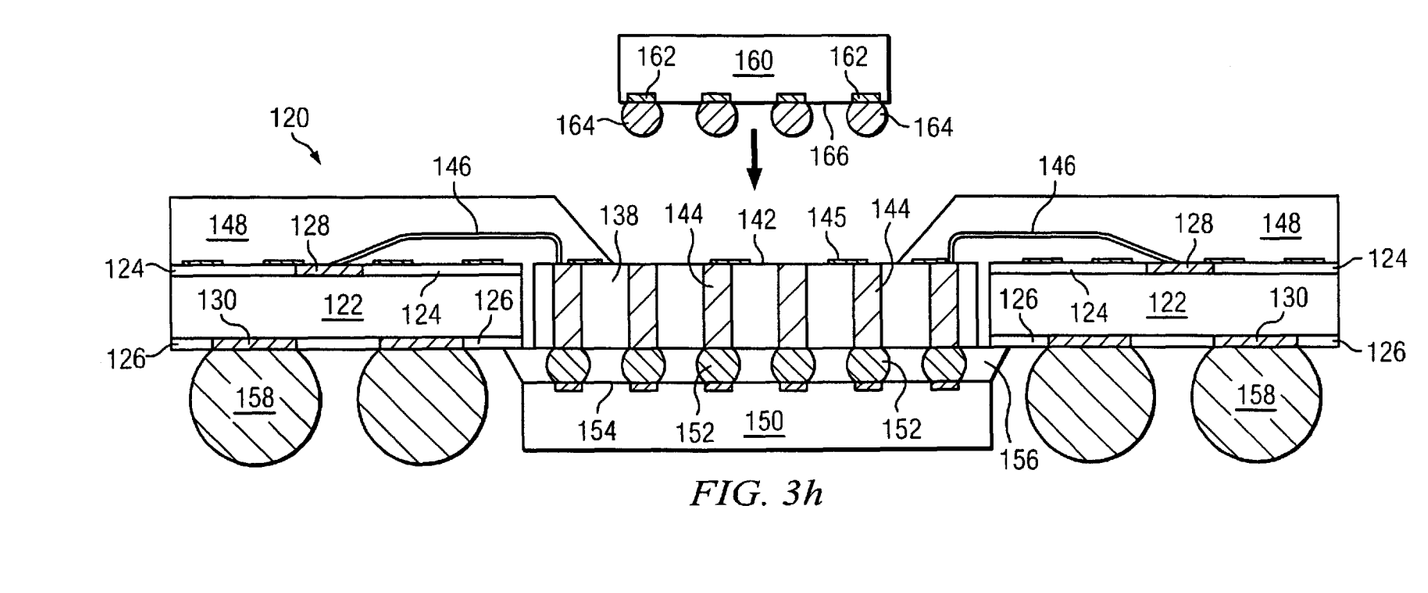
Figure 5:
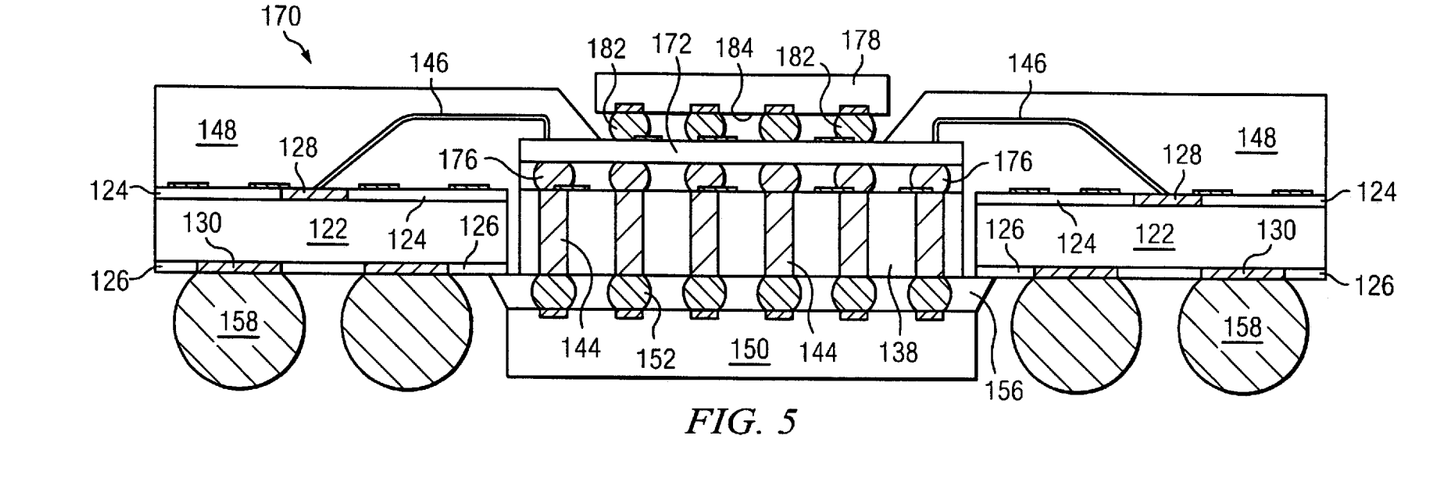
FIG. 5 illustrates the stacked die interconnected with a TSV interposer disposed in the cavity of the substrate.

FIG. 5 shows Fi-PoP structure 170 including the features described in FIGS. 3a-3f. In addition, laminate or leadframe interposer 172 is electrically connected to TSV 144 with bumps 176. Bond wires 146 are electrically connected through interposer 172 to TSV 144. Semiconductor die or component 178 with contact pads oriented downward in a flipchip arrangement is mounted to interposer 172 with bumps 182. Semiconductor die 178 includes an active surface 184 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 184 to implement baseband analog circuits or digital circuits, such as DSP, ASIC, memory, or other signal processing circuit. Semiconductor die 178 may also contain IPD, such as inductors, capacitors, and resistors, for RF signal processing. A typical RF system requires multiple IPDs in one or more semiconductor packages to perform the necessary electrical functions. In another embodiment, semiconductor component 178 can be a discrete semiconductor device mounted to interposer 172. The remainder of the features described in FIGS. 3g-3h is added to Fi-PoP structure 170.

Figure 6:
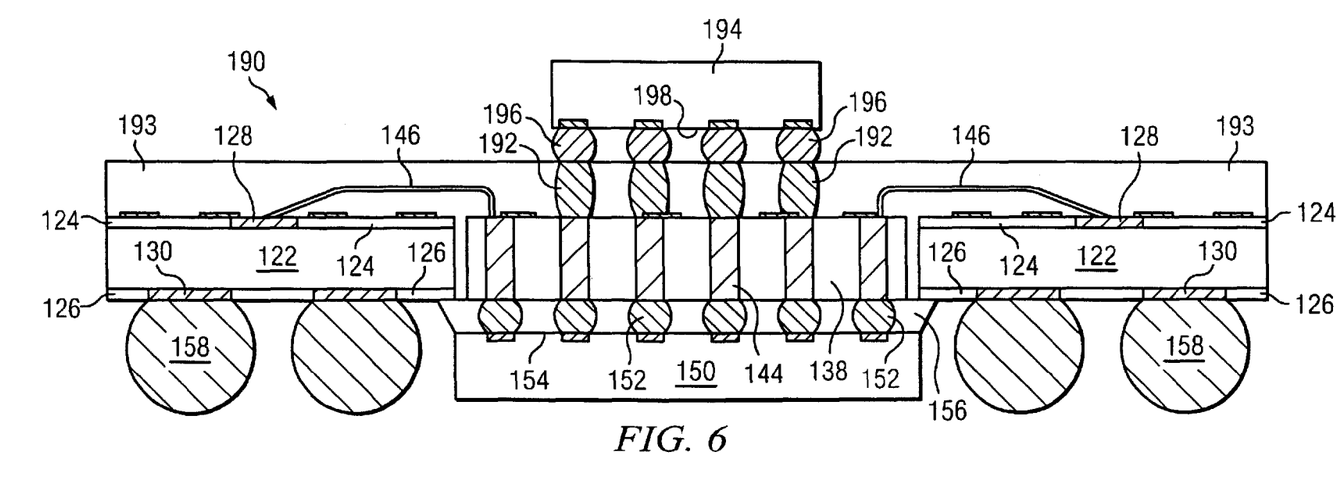
FIG. 6 illustrates the stacked die interconnected with embedded bumps and TSV in the cavity of the substrate.

FIG. 6 shows Fi-PoP structure 190 including the features described in FIGS. 3a-3f. In addition, embedded bumps 192 are electrically connected to TSV 144 and bond wires 146. An encapsulant or molding compound 193 is deposited over semiconductor die 138 and insulating layer 124 using a paste printing, compressive molding, transfer molding, liquid encapsulant molding, vacuum lamination, or other suitable applicator. Alternatively, embedded conductive pillars or mold vias can be formed instead of embedded bumps for finer pitch interconnection. Encapsulant 193 can be polymer composite material, such as epoxy resin with filler, epoxy acrylate with filler, or polymer with proper filler. Encapsulant 193 is non-conductive and environmentally protects the semiconductor device from external elements and contaminants.

Semiconductor die or component 194 with contact pads oriented downward in a flipchip arrangement is mounted to embedded bumps 192 with bumps 196. Semiconductor die 194 includes an active surface 198 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 198 to implement baseband analog circuits or digital circuits, such as DSP, ASIC, memory, or other signal processing circuit. Semiconductor die 194 may also contain IPD, such as inductors, capacitors, and resistors, for RF signal processing. A typical RF system requires multiple IPDs in one or more semiconductor packages to perform the necessary electrical functions. In another embodiment, semiconductor component 194 can be a discrete semiconductor device mounted to embedded bumps 192. The remainder of the features described in FIGS. 3g-3h is added to Fi-PoP structure 190. Bumps 192 allow semiconductor component 194 to be mounted over encapsulant 193 and electrically connected to TSV 144 without a dedicated mold chase or specialized encapsulation processes to expose semiconductor die 138.

Figure 7:
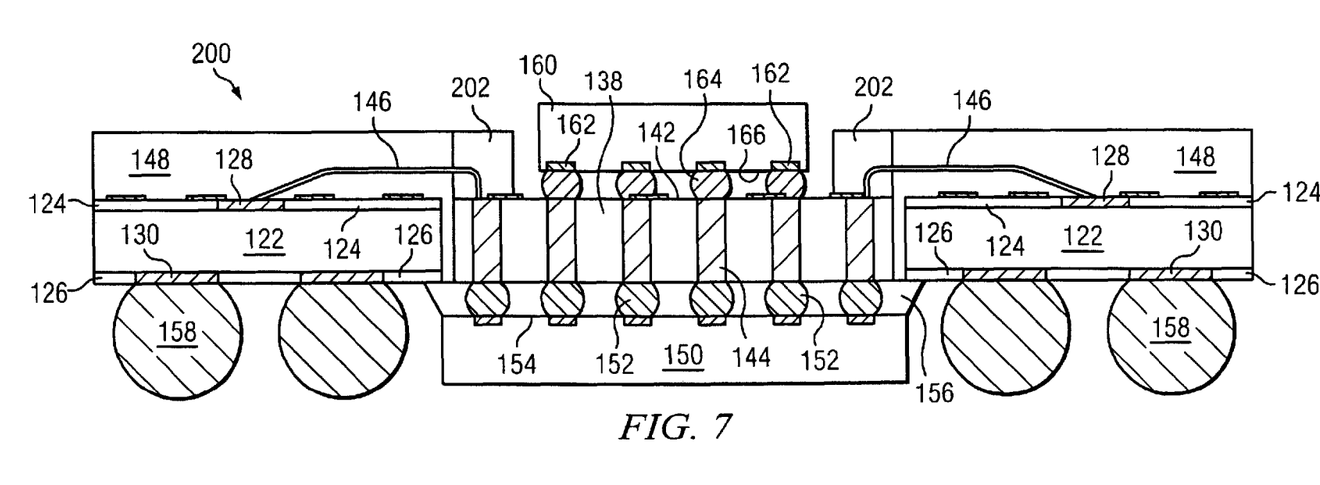
FIG. 7 illustrates the stacked die interconnected with TSV and bond wires covered by wire-in-film material.

FIG. 7 shows Fi-PoP structure 200 including the features similar to FIGS. 3a-3f. In addition, dam material or wire-on-film (WIF) encapsulant material 202 is deposited over semiconductor die 138 which eliminates the need for a dedicated mold chase or specialized encapsulation processes to expose the die. The remainder of the features described in FIGS. 3g-3h is added to Fi-PoP structure 200.

Figure 8:
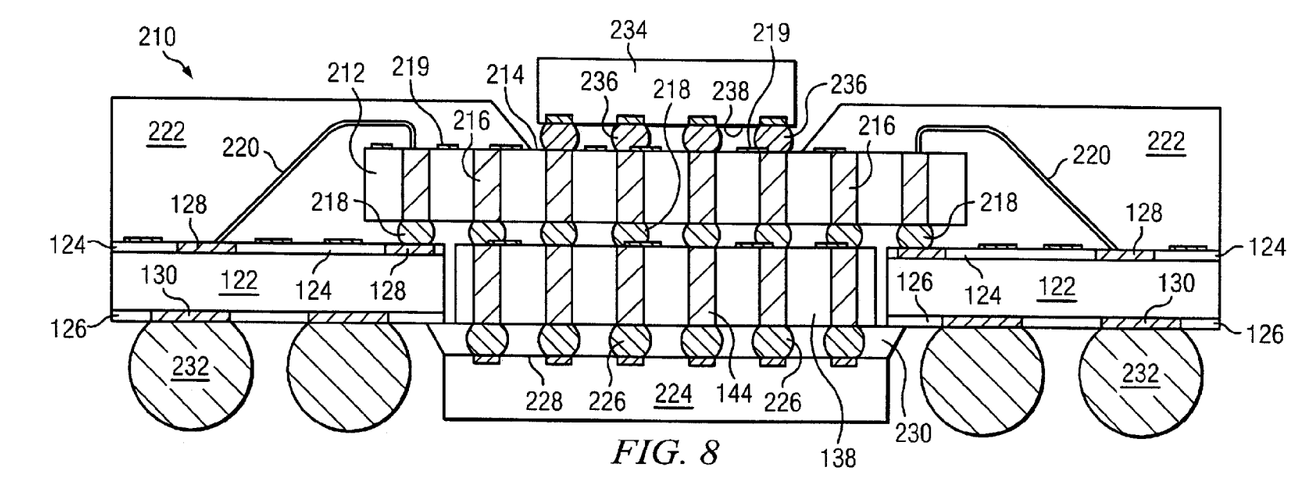
FIG. 8 illustrates the stacked die interconnected with the TSV die mounted over the substrate cavity.

FIG. 8 shows Fi-PoP structure 210 including the features described in FIGS. 3a-3f. In addition, semiconductor die or component 212 is mounted over semiconductor die 138 and electrically connected to TSV 144 and conductive layer 128 with bumps 218. Semiconductor die 212 includes an active surface 214 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 214 to implement baseband analog circuits or digital circuits, such as DSP, ASIC, memory, or other signal processing circuit. Semiconductor die 212 may also contain IPD, such as inductors, capacitors, and resistors, for RF signal processing. A typical RF system requires multiple IPDs in one or more semiconductor packages to perform the necessary electrical functions. In another embodiment, semiconductor die or component 212 is an interposer with TSVs mounted over semiconductor die 138.

A plurality of vias is formed through semiconductor die or interposer 212 using laser drilling or etching process, such as DRIE. The vias are filled with Al, Cu, Sn, Ni, Au, Ag, Ti, W, poly-silicon, or other suitable electrically conductive material using PVD, CVD, electrolytic plating, electroless plating process, or other suitable metal deposition process to form conductive TSVs 216. TSV 216 can be formed in semiconductor die 212 prior to mounting over cavity 136. TSV 216 can be electrically interconnected according to the design of the die with optional RDL 219 on active surface 214.

Bond wires 220 are formed between conductive layer 128 and TSV 216. An encapsulant or molding compound 222 is deposited over semiconductor die 212 and insulating layer 124 using a paste printing, compressive molding, transfer molding, liquid encapsulant molding, vacuum lamination, or other suitable applicator. Encapsulant 222 can be polymer composite material, such as epoxy resin with filler, epoxy acrylate with filler, or polymer with proper filler. Encapsulant 222 is non-conductive and environmentally protects the semiconductor device from external elements and contaminants. A portion of encapsulant 222 is removed by an etching process to expose active surface 214 and TSV 216.

Semiconductor die or component 224 is mounted to TSV 144, opposite active surface 142, using bumps 226. Semiconductor die 224 includes an active surface 228 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 228 to implement baseband analog circuits or digital circuits, such as DSP, ASIC, memory, or other signal processing circuit. Semiconductor die 224 may also contain IPD, such as inductors, capacitors, and resistors, for RF signal processing. A typical RF system requires multiple IPDs in one or more semiconductor packages to perform the necessary electrical functions. An underfill material 230 such as epoxy resin is deposited under semiconductor die 224. In another embodiment, semiconductor component 224 can be a discrete semiconductor device mounted to TSV 144.

An electrically conductive bump material is deposited over conductive layer 130 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 130 using a suitable attachment or bonding process. In one embodiment, the bump material is reflowed by heating the material above its melting point to form spherical balls or bumps 232. In some applications, bumps 232 are reflowed a second time to improve electrical contact to conductive layer 130. The bumps can also be compression bonded to conductive layer 130. Bumps 232 represent one type of interconnect structure that can be formed over conductive layer 130. The interconnect structure can also use bond wires, stud bump, micro bump, or other electrical interconnect.

Semiconductor die or component 234 with contact pads oriented downward in a flipchip arrangement is mounted to TSV 216 with bumps 236. Semiconductor die 234 includes an active surface 238 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 238 to implement baseband analog circuits or digital circuits, such as DSP, ASIC, memory, or other signal processing circuit. Semiconductor die 234 may also contain IPD, such as inductors, capacitors, and resistors, for RF signal processing. A typical RF system requires multiple IPDs in one or more semiconductor packages to perform the necessary electrical functions. In another embodiment, semiconductor component 234 can be a discrete semiconductor device mounted to TSV 216.

Figure 9:
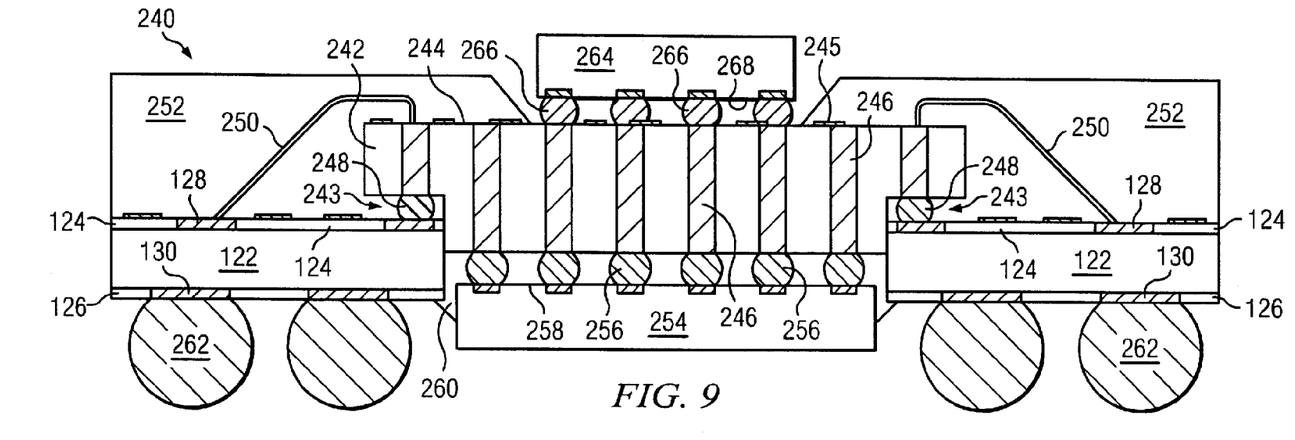
FIG. 9 illustrates the stacked die interconnected with the TSV die extending outside the substrate cavity.

FIG. 9 shows Fi-PoP structure 240 including the features described in FIGS. 3a-3f. In addition, semiconductor die or component 242 disposed partially in and partially out of cavity 136. Semiconductor die 242 further includes notch or recess 243 which overhangs substrate 120 outside cavity 136. Semiconductor die 242 includes an active surface 244 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 244 to implement baseband analog circuits or digital circuits, such as DSP, ASIC, memory, or other signal processing circuit. Semiconductor die 242 may also contain IPD, such as inductors, capacitors, and resistors, for RF signal processing. A typical RF system requires multiple IPDs in one or more semiconductor packages to perform the necessary electrical functions. In another embodiment, semiconductor die or component 242 is an interposer with TSVs disposed partially in and partially out of cavity 136.

A plurality of vias is formed through semiconductor die or interposer 242 using laser drilling or etching process, such as DRIE. The vias are filled with Al, Cu, Sn, Ni, Au, Ag, Ti, W, poly-silicon, or other suitable electrically conductive material using PVD, CVD, electrolytic plating, electroless plating process, or other suitable metal deposition process to form conductive TSV 246. TSV 246 can be formed in semiconductor die 242 prior to mounting the die in cavity 136. TSV 246 can be electrically interconnected according to the design of the die with optional RDL 245 on active surface 244 and substrate 120. TSV 246 in notch 243 are electrically connected to conductive layer 128 with bumps 248.

Bond wires 250 are formed between conductive layer 128 and TSV 246. An encapsulant or molding compound 252 is deposited over semiconductor die 242 and insulating layer 124 using a paste printing, compressive molding, transfer molding, liquid encapsulant molding, vacuum lamination, or other suitable applicator. Encapsulant 252 can be polymer composite material, such as epoxy resin with filler, epoxy acrylate with filler, or polymer with proper filler. Encapsulant 252 is non-conductive and environmentally protects the semiconductor device from external elements and contaminants. A portion of encapsulant 252 is removed by an etching process to expose active surface 244 and TSV 246.

Semiconductor die or component 254 is mounted to TSV 246, opposite active surface 244, using bumps 256. Semiconductor die 254 includes an active surface 258 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 258 to implement baseband analog circuits or digital circuits, such as DSP, ASIC, memory, or other signal processing circuit. Semiconductor die 254 may also contain IPD, such as inductors, capacitors, and resistors, for RF signal processing. A typical RF system requires multiple IPDs in one or more semiconductor packages to perform the necessary electrical functions. An underfill material 260 such as epoxy resin is deposited under semiconductor die 254. In another embodiment, semiconductor component 254 can be a discrete semiconductor device mounted to TSV 246.

An electrically conductive bump material is deposited over conductive layer 130 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 130 using a suitable attachment or bonding process. In one embodiment, the bump material is reflowed by heating the material above its melting point to form spherical balls or bumps 262. In some applications, bumps 262 are reflowed a second time to improve electrical contact to conductive layer 130. The bumps can also be compression bonded to conductive layer 130. Bumps 262 represent one type of interconnect structure that can be formed over conductive layer 130. The interconnect structure can also use bond wires, stud bump, micro bump, or other electrical interconnect.

Semiconductor die or component 264 with contact pads oriented downward in a flipchip arrangement is mounted to TSV 246 with bumps 266. Semiconductor die 264 includes an active surface 266 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 266 to implement baseband analog circuits or digital circuits, such as DSP, ASIC, memory, or other signal processing circuit. Semiconductor die 264 may also contain IPD, such as inductors, capacitors, and resistors, for RF signal processing. A typical RF system requires multiple IPDs in one or more semiconductor packages to perform the necessary electrical functions. In another embodiment, semiconductor component 264 can be a discrete semiconductor device mounted to TSV 246.

Figure 10:
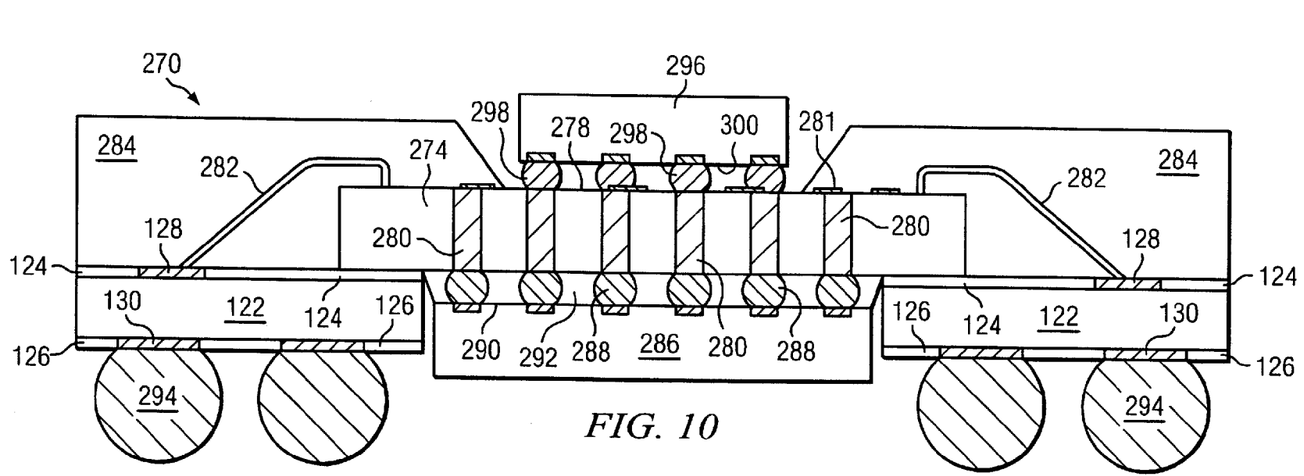
FIG. 10 illustrates the stacked die interconnected with the TSV die disposed outside the substrate cavity.

FIG. 10 shows Fi-PoP structure 270 including the features described in FIGS. 3a-3c and semiconductor die or component 274 mounted over cavity 136. Semiconductor die 274 includes an active surface 278 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 278 to implement baseband analog circuits or digital circuits, such as DSP, ASIC, memory, or other signal processing circuit. Semiconductor die 274 may also contain IPD, such as inductors, capacitors, and resistors, for RF signal processing. A typical RF system requires multiple IPDs in one or more semiconductor packages to perform the necessary electrical functions. In another embodiment, semiconductor die or component 274 is an interposer with TSVs mounted over cavity 136.

A plurality of vias is formed through semiconductor die or interposer 274 using laser drilling or etching process, such as DRIE. The vias are filled with Al, Cu, Sn, Ni, Au, Ag, Ti, W, poly-silicon, or other suitable electrically conductive material using PVD, CVD, electrolytic plating, electroless plating process, or other suitable metal deposition process to form conductive TSVs 280. TSV 280 can be formed in semiconductor die 274 prior to mounting the die. TSV 280 can be electrically interconnected according to the design of the die with optional RDL 281 on active surface 278.

Bond wires 282 are formed between conductive layer 128 and active surface 278. An encapsulant or molding compound 284 is deposited over semiconductor die 274 and insulating layer 124 using a paste printing, compressive molding, transfer molding, liquid encapsulant molding, vacuum lamination, or other suitable applicator. Encapsulant 284 can be polymer composite material, such as epoxy resin with filler, epoxy acrylate with filler, or polymer with proper filler. Encapsulant 284 is non-conductive and environmentally protects the semiconductor device from external elements and contaminants. A portion of encapsulant 284 is removed by an etching process to expose active surface 278 and TSV 280.

Semiconductor die or component 286 is mounted to TSV 280, opposite active surface 278, using bumps 288. Semiconductor die 286 includes an active surface 290 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 290 to implement baseband analog circuits or digital circuits, such as DSP, ASIC, memory, or other signal processing circuit. Semiconductor die 286 may also contain IPD, such as inductors, capacitors, and resistors, for RF signal processing. A typical RF system requires multiple IPDs in one or more semiconductor packages to perform the necessary electrical functions. An underfill material 292 such as epoxy resin is deposited under semiconductor die 286. In another embodiment, semiconductor component 286 can be a discrete semiconductor device mounted to TSV 280.

An electrically conductive bump material is deposited over conductive layer 130 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 130 using a suitable attachment or bonding process. In one embodiment, the bump material is reflowed by heating the material above its melting point to form spherical balls or bumps 294. In some applications, bumps 294 are reflowed a second time to improve electrical contact to conductive layer 130. The bumps can also be compression bonded to conductive layer 130. Bumps 294 represent one type of interconnect structure that can be formed over conductive layer 130. The interconnect structure can also use bond wires, stud bump, micro bump, or other electrical interconnect.

Semiconductor die or component 296 with contact pads oriented downward in a flipchip arrangement is mounted to TSV 280 with bumps 298. Semiconductor die 296 includes an active surface 300 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 300 to implement baseband analog circuits or digital circuits, such as DSP, ASIC, memory, or other signal processing circuit. Semiconductor die 296 may also contain IPD, such as inductors, capacitors, and resistors, for RF signal processing. A typical RF system requires multiple IPDs in one or more semiconductor packages to perform the necessary electrical functions. In another embodiment, semiconductor component 296 can be a discrete semiconductor device mounted to TSV 280.

Figure 11:
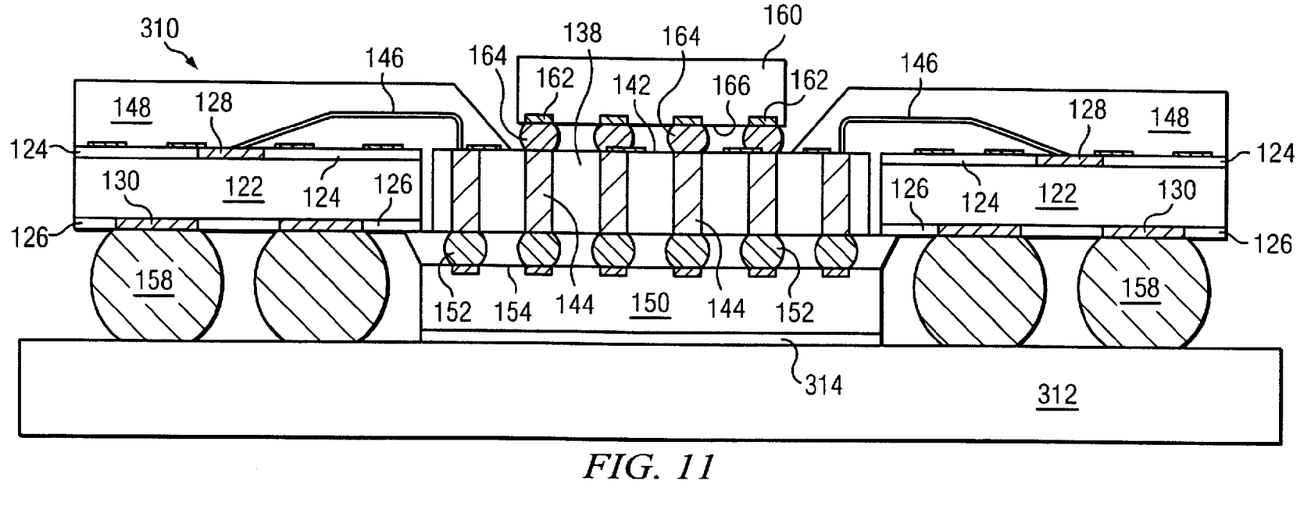
FIG. 11 illustrates the Fi-PoP with stacked die and heat sink.

FIG. 11 shows Fi-PoP structure 310 including the features described in FIGS. 3a-3g mounted to PCB 312. A heat sink 314 is placed between the back surface of semiconductor die 150. Heat sink 314 can be Al, Cu, or another material with high thermal conductivity to provide heat dissipation for semiconductor die 150.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of manufacturing a semiconductor device, comprising:
   providing a substrate;
   forming a first cavity through the substrate;
   forming a via through a first semiconductor die;
   filling the via with conductive material to form a conductive via;
   mounting the first semiconductor die in the first cavity;
   depositing an encapsulant over the substrate and a first surface of the first semiconductor die;
   removing a portion of the encapsulant to create a second cavity within the encapsulant and to expose the first surface of the first semiconductor die;
   mounting a second semiconductor die to the first surface of the first semiconductor die with an active surface of the second semiconductor die disposed within the second cavity to reduce a height of the semiconductor device, the second semiconductor die being electrically connected to the conductive via; and
   mounting a third semiconductor die over a second surface of the first semiconductor die opposite the first surface of the first semiconductor die such that the third semiconductor die is electrically connected to the second semiconductor die through the conductive via in the first semiconductor die.

2. The method of claim 1, further including:
   forming a first conductive layer on the substrate; and
   forming a bond wire between the first conductive layer and conductive via.

3. The method of claim 1, further including disposing an interposer between the first semiconductor die and second semiconductor die.

4. The method of claim 1, further including disposing a fourth semiconductor die having conductive vias between the first semiconductor die and second semiconductor die.

5. The method of claim 1, wherein the first semiconductor die extends above the first cavity.

6. The method of claim 1, further including forming a heat sink over a surface of the third semiconductor die opposite the first semiconductor die.

7. A method of manufacturing a semiconductor device, comprising:
    providing a substrate;
    forming a first cavity through the substrate;
    providing a first semiconductor component;
    forming a conductive through silicon via (TSV) through the first semiconductor component;
    mounting the first semiconductor component in the first cavity;
    depositing an encapsulant over the substrate and a first surface of the first semiconductor component;
    removing a portion of the encapsulant to create a second cavity within the encapsulant over the first surface of the first semiconductor component; and
    mounting a second semiconductor component to the first surface of the first semiconductor component with a surface of the second semiconductor die disposed within the second cavity, the second semiconductor component being electrically connected to the conductive TSV.

8. The method of claim 7, further including mounting a third semiconductor component over a second surface of the first semiconductor component opposite the first surface of the first semiconductor component.

9. The method of claim 7, further including:
    forming a first conductive layer on the substrate; and
    forming a bond wire between the first conductive layer and conductive TSV.

10. The method of claim 7, further including disposing an interposer between the first semiconductor component and second semiconductor component.

11. The method of claim 7, further including disposing a third semiconductor component having conductive vias between the first semiconductor component and second semiconductor component.

12. The method of claim 7, wherein the first semiconductor component extends above the first cavity.

13. The method of claim 7, wherein the first semiconductor component is a semiconductor die, integrated passive device, or interposer.

14. A method of manufacturing a semiconductor device, comprising:
    providing a substrate;
    forming first a cavity through the substrate;
    providing a first semiconductor component;
    forming a conductive through silicon via (TSV) through the first semiconductor component;
    mounting the first semiconductor component in the cavity;
    depositing an encapsulant over the substrate and a first surface of the first semiconductor component;
    removing a portion of the encapsulant over the first semiconductor component to create a second cavity within the encapsulant; and
    mounting a second semiconductor component over the first surface of the first semiconductor component with a portion of the second semiconductor die disposed within the second cavity.

15. The method of claim 14, further including forming bumps between the first semiconductor component and second semiconductor component.

16. The method of claim 14, further including disposing an interposer between the first semiconductor component and second semiconductor component.

17. The method of claim 14, further including disposing a fourth semiconductor component having conductive TSV between the first semiconductor component and second semiconductor component.

18. The method of claim 14, wherein the first semiconductor component is a semiconductor die, integrated passive device, or interposer.

19. The method of claim 14, further including:
    forming a first conductive layer on the substrate;
    forming a bond wire between the first conductive layer and conductive TSV; and
    depositing wire-in-film material over the bond wire.

20. The method of claim 14, further including mounting a third semiconductor component over a second surface of the first semiconductor component opposite the first surface of the first semiconductor component such that the third semiconductor component is electrically connected to the second semiconductor component through the conductive via in the first semiconductor component.

* * * * *